United States Patent [19]
Igarashi et al.

[11] Patent Number: 5,990,546
[45] Date of Patent: *Nov. 23, 1999

[54] CHIP SCALE PACKAGE TYPE OF SEMICONDUCTOR DEVICE

[75] Inventors: Kazumasa Igarashi; Megumu Nagasawa; Satoshi Tanigawa; Hideyuki Usui; Nobuhiko Yoshio; Hisataka Ito, all of Osaka, Japan

[73] Assignee: Nitto Denko Corporation, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/581,260

[22] Filed: Dec. 29, 1995

[30] Foreign Application Priority Data

Dec. 29, 1994 [JP] Japan .................................. 6-339909
Apr. 1, 1995 [JP] Japan .................................. 7-100393

[51] Int. Cl.$^6$ ................................................. H01L 23/053
[52] U.S. Cl. ......................... 257/700; 257/737; 257/778; 257/787
[58] Field of Search .................... 257/690, 666, 257/737, 738, 778, 787, 700

[56] References Cited

U.S. PATENT DOCUMENTS

| | | | |
|---|---|---|---|
| 5,222,014 | 6/1993 | Lin | 257/701 |
| 5,311,059 | 5/1994 | Baneri et al. | 257/778 |
| 5,450,283 | 9/1995 | Lin et al. | 257/787 |
| 5,535,101 | 7/1996 | Miles et al. | 257/686 |

FOREIGN PATENT DOCUMENTS 0105924 5/1991 Japan .................................... 257/737

*Primary Examiner*—Carl Whitehead, Jr.
*Assistant Examiner*—Roy Potter
*Attorney, Agent, or Firm*—Sughrue, Mion, Zinn, Macpeak & Seas, PLLC

[57] ABSTRACT

A semiconductor device in which the space between a semiconductor chip and an auxiliary wiring plate is sealed with resin. The auxiliary wiring plate has insulating layers and on both sides of the routing conductor, the insulating layer on the side of the semiconductor chip has a hole being led from the routing conductor to the electrode of the semiconductor chip, the metal filled in the hole and the metal bump formed so as to protrude from the hole serves as an inner electrode. The semiconductor device can be manufactured by the TAB technique.

19 Claims, 6 Drawing Sheets

FIG. 3(C)

CHIP SCALE PACKAGE TYPE OF SEMICONDUCTOR DEVICE

BACKGROUND OF THE INVENTION

1. Field of the Invention

The present invention relates to a chip scale package (CSP) type of semiconductor device and a method of manufacturing it.

2. Description of the Prior Art

The structure of a semiconductor device as shown in FIG. 9 is previously known in which with the inner lead portion 122 of a lead 102 connected (bump-connected) to an electrode 111 of a semiconductor chip 101 and while the outer lead portion 123 of the lead 102 is protruded, a semiconductor chip 101 is sealed with resin 103.

This semiconductor device can be manufactured by the "TAB" (Tape automated bonding) technique.

Specifically, a film carrier tape (having sprocket holes) with a large number of leads (copper foils being formed by etching) formed at regular intervals, each having an inner lead portion and outer lead portion, is intermittently transported by sprockets. At a chip attachment station, an electrode of the semiconductor chip is connected to the inner lead portion of each lead on the film carrier tape using a bump. Further, at a resin applying station, sealing resin is dropped and applied onto the surface of the electrode side of a semiconductor chip. Thereafter, the film carrier tape is stamped around the semiconductor chip. Thus, the semiconductor device can be manufactured.

The above package structure, however, requires the pitch of the outer lead portions of the leads to be greatly extended from the point of view of accuracy of soldering, which results in a large scale of package. This is disadvantageous to realize the semiconductor device with a high density.

To solve the above problem, several proposals have been made for a chip scale package type of semiconductor device. The semiconductor device as shown in FIG. 10 belongs to a chip scale package type. In addition, without being restrained by the arrangement of the electrodes 411 of a semiconductor chip 401, the arrangement of the outer electrodes 422 soldered to the conductor end of a circuit board to be packaged can be freely set within the chip scale so that the interval of the outer electrodes 422 and 422 can be sufficiently increased.

In FIG. 10, reference numeral 401 denotes a semiconductor chip and reference numeral 402 denotes an auxiliary wiring plate in which routing conductors 424 are printed on the one side of an insulating supporting plate (ceramic plate) 425. A metallic bump 412 is adhered to each of electrodes 411 of the semiconductor chip 401. The metallic pump 412 is connected to the end 441 of the routing conductor 424. The space between the semiconductor chip 401 and the auxiliary wiring plate piece 402 is sealed with resin 403. Holes 421 are provided at the positions corresponding to the conductor ends of a circuit board. The holes 421 are filled with solders 422. A soldering bump 423 is formed on each of the solders 422. The semiconductor chip 401 is fixed on the molding circuit board using the soldering bumps 423 by the reflow method.

In the chip scale type package type of semiconductor device, the metallic bumps 412 must be previously adhered to the electrodes 411 of the semiconductor chip 401. This makes the process of manufacturing a semiconductor chip complicate, deteriorates the yielding rate of products and hence increases the production cost of semiconductor chips.

Since the insulating supporting plate 425 of the auxiliary wiring plate 402 is made of the ceramic plate, it is difficult to adopt the TAB method for manufacturing the semiconductor device according to the above invention.

SUMMARY OF THE IMVENTION

An object of the present invention is to provide a chip-scale package type of low cost semiconductor device in which the arrangement of external electrodes soldered to the conductor ends of a circuit board can be freely set within a range of a chip scale without being restrained by the electrode arrangement of a semiconductor chip. Another object of the present invention is to provide a method of manufacturing such a chip-scale package type semiconductor device by the TAB method.

There is provided with a semiconductor device comprising: a semiconductor chip having an electrode; a first insulating layer facing the semiconductor chip; a second insulating layer laminated on the first insulating layer; an inner electrode fixed on the first insulating layer, the inner electrode being connected to the electrode of the semiconductor chip; an outer electrode fixed on the second insulating layer, the outer electrode being connected to a conductor end of a circuit board; a routing conductor bridging the inner and outer electrodes, the routing conductor being sandwiched by the first and second insulating layers; and resin sealing with the space between the semiconductor chip and the first insulating layer.

The semiconductor device according to the present invention, further comprises: other insulating layer; and other routing conductor; wherein each routing conductor is sandwiched by each different pair of the insulating layer corresponding to the each routing conductor and has the inner electrode and the outer electrode.

In the semiconductor device according to the present invention, the transverse edges of the outer surface of the semiconductor chip are sealed with one of resin and a bonding sheet.

In the semiconductor device according to the present invention, the entire outer surface of the semiconductor chip is sealed with one of resin and a bonding sheet.

In the semiconductor device according to the present invention, the planar area of the first and second insulating layers is in the range from equal to that of the semiconductor chip to 200% of that of the semiconductor chip.

In the semiconductor device according to the present invention, the surface tension of the first insulating layer in contact with the sealing resin is larger than 35 mJ/m$^2$.

In the semiconductor device according to the present invention, the surface of the first insulating layer in contact with the sealing resin has uneven spots each having a diameter in the range from 0.005 $\mu$m to 0.5 $\mu$m.

Further, there is provided with a method of manufacturing a semiconductor device comprising the steps of: (1) preparing a first insulating support film and a semiconductor chip having an electrode; (2) printing a routing conductor on a first surface of the first insulating support film; (3) making a first hole led to the routing conductor in the first insulating support film; (4) filling the first hole with metal; (5) forming a metallic bump on the filling metal to form an inner electrode; (6) coating the first surface with resin to form a second insulating film so that the routing conductor is sandwiched by the first and second insulating films; (7) making a second hole led to the routing conductor in the second insulating support film; (8) filling the second hole with solder to form an outer electrode; (9) connecting the electrode of the semiconductor chip and the inner electrode; and (10) sealing the first insulating support film and the semiconductor chip with resin to form the semiconductor device.

In the method of manufacturing a semiconductor device according to the present invention, the first insulating support film has a large dimension in a longitudinal direction thereof, the steps (2) to (8) are repeated in the longitudinal direction intermittently to arrange the routing conductor, the inner electrode and the outer electrode on the first insulating support film at predetermined intervals so that a film carrier tape is formed while the first insulating film is transported to the longitudinal direction, the electrode of the semiconductor chip is connected to the inner electrode at least the space between the film carrier tape and the semiconductor chip is sealed with resin and the film carrier tape is punched out so as to define the periphery of the semiconductor chip.

The metallic bump of the inner electrode of the auxiliary electrode in contact with the electrode of the semiconductor chip can be made by the process including making the hole in the insulating layer of the auxiliary wiring plate, filling the hole with metal, melting the tip of the metal wire (metal wire, solder wire, etc.), making a sphere of the molten metal by surface tension, and applying the spherical molten metal on the top of the filling metal (wire bumping). Otherwise, the metallic bump can be made by the method of swelling the metal on the top of the filling metal by plating.

In this case, application force of the molten metal or metal ions onto the metallic surface of the hole is much larger than that of the molten metal or metal ions onto the synthetic resin around the hole. For this reason, metal is applied to only the top of the filling metal to make a good metal bump and exclude any poor metal bump due to extension of metal.

The method of making a metallic bump according to the present invention insures a more improved yielding rate than the case of forming a metal bump on the electrode of a semiconductor or directly the end of the routing conductor.

Particularly, where the multi-layer structure is adopted for the auxiliary wiring plate, routing conductors for different electrodes of the semiconductor chip can be wired in a three-dimensional space. This makes it unnecessary to provide a routing wiring for excluding the wire crossing in the wiring in the two dimensional space (i.e., wiring in the same plane), and can correspondingly shorten the length of the routing conductor, thus improving the linear characteristic of the semiconductor chip.

Since the surface in contact with the sealing resin of the auxiliary wiring plate is a resin film surface, an increase in the surface tension of the film surface and miniaturized asperity processing makes the conductive failure rate substantially zero, thus improving a chip scale package type of semiconductor device.

BRIEF DESCRIPTION OF THE DRAWINGS

FIG. 3(A) to FIG. 3(I) are explanation views showing the procedure sequence of a method of manufacturing a semiconductor device according to the present invention;

DETAILED DESCRIPTION OF THE PREFERRED EMBODIMENTS

Figure 1A:
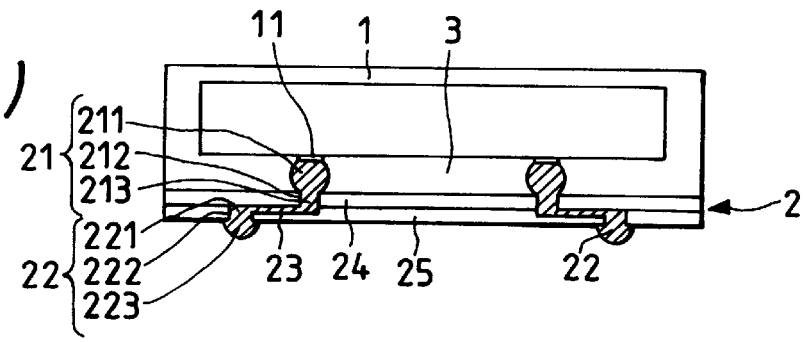
FIG. 1(A) and FIG. (B) are explanation views showing an embodiment of the semiconductor device according to the present invention and FIG. 1(C) is an explanation view showing another embodiment.

The semiconductor device according to the present invention can be manufactured so that the production can be rationalized by automation.

Now referring to the drawing, an explanation will be given of embodiments of the present invention.

Figure 1B:
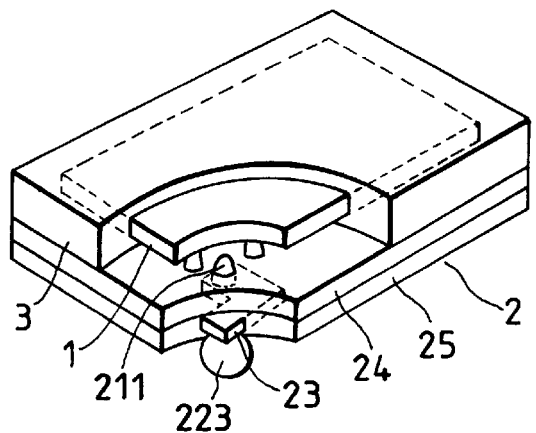
Figure 1C:
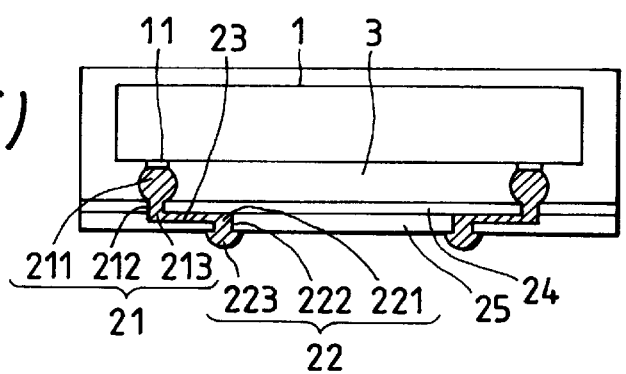

(A) of FIG. 1 is an explanation view showing one embodiment of the semiconductor device according to the present invention. (B) of FIG. 1 is a perspective view of the semiconductor device with its portion recessed in which routing conductors are routed externally.

(C) of FIG. 1 is an explanation view showing another embodiment of a semiconductor device according to the present invention in which routing conductors are routed internally.

In (A) to (C) of FIG. 1, reference numeral 1 denotes a semiconductor chip. Reference numeral 2 denotes an auxiliary wiring plate which includes an inner electrode 21 coupled with the electrode 11 of the semiconductor chip 1 through a metallic bump 211, an outer electrode 22 located at a different position from the back position of the inner electrode 21, a routing conductor 23 extended between both electrodes 21 and 22 and insulating layers 24 and 25 formed on both surfaces of the routing conductor 23. The space between the semiconductor chip 1 and the auxiliary wiring plate 2 is sealed with resin 3. The inner electrode 21 is composed of metal 213 filled in an inner electrode hole 212 made in the insulating layer 24 and a metallic bump 211 formed at the end surface of the filling metal 213. The outer electrode 22 is composed of metal 222 filled in the outer electrode hole 221 made in the insulating layer 25. A metal bump 223 is formed on the end surface of the filling metal 222.

The size of the auxiliary wiring plate 2 is equal to the planar size of the semiconductor chip (generally, 3 mm–20 mm square), or not greater than 200% of the planar size of the semiconductor chip 1, preferably not greater than 130%.

The outer electrodes 22 are generally arranged at substantially regular intervals because the interval therebetween is required as large as possible within the planar size of the auxiliary wiring plate 2 in order to prevent any solder bridge in soldering the electrodes in a mounting circuit board.

Figure 2:
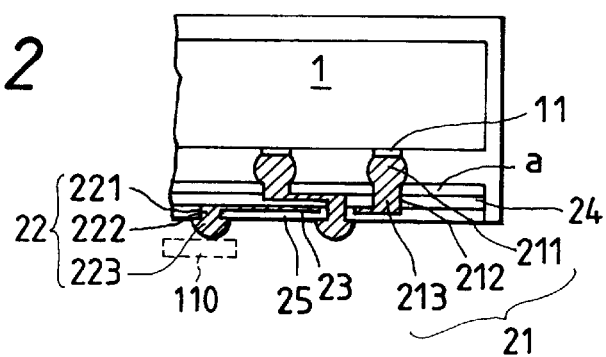
FIG. 2 is an explanation view showing still another embodiment of the semiconductor device according to the present invention.

The auxiliary wiring plate 2 may have a multi-layer structure as shown in FIG. 2. In FIG. 2, a pair of one electrode 11 of the semiconductor chip 1 and the conductor end 110 of the circuit board to be connected thereto are caused to correspond to the routing conductor 23 of one layer. A hole 212 guided from the routing conductor 23 to the electrode 11 of the semiconductor chip 1 is made in an insulating laminated layer a. The hole 212 is filled with metal 213. The metallic bump 213 is formed on the top of the filling metal 213 so that the inner electrode 21 for the routing conductor 23 is formed. On the other hand, a hole 221 corresponding to one conductor end 110 of the circuit board, which should be connected to the electrode 11 of the semiconductor chip 11 through the routing conductor 23, is made in an insulating layer 25. The hole 221 is filled with metal 222 so as to form the outer electrode 22 for the routing conductor 23. The top of the filling metal 222 is connected to the conductor end of the mounting circuit board through the metallic bump 223.

The above semiconductor device can be manufactured in the process of (A) to (I) of FIG. 3.

First, as shown in (A) of FIG. 3, a routing conductor 23 is printed on one surface of an insulating supporting film 24. The routing conductor 23 is preferably printed by chemically etching the metallic film of a metallic foil laminated synthetic resin film into a predetermined pattern. The metallic foil laminated synthetic resin may be a double layer material in which a copper foil fused with the synthetic resin film, and a triple layer material in which the copper foil is bonded to the synthetic resin through a thermoplastic or thermosetting bonding agent. The synthetic resin may be any material as long as it has heat resistance in forming a metallic bump by wire bumping and medicine resistance in forming the metallic bump by plating. For example, it may a polyimide film, polyethylene terephthalate film, a polyetherimide film, a polyethersulfone film, polyphenylene sulfide film, a polyether ketone film, etc. The synthetic resin film generally has a thickness of 10–150 $\mu$m.

Figure 3A:
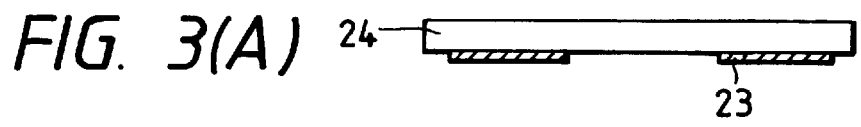
Figure 3B:

After the routing conductors 23 are formed by printing in this way, as shown in FIG. 3(B), a hole 212 for an inner electrode is made in the insulating supporting film 24. The hole can be generally made by drilling, laser etching, etc. Particularly, in the case of the polyimide film, a wet hole-making technique such as alkaline etching can be used. In the case of the double layer material polyimide film, a hole can be made in e.g., photosensitive polyimide by light exposure.

After the hole 212 is made, as shown in FIG. 3(C), using the insulating film 24 as a plating mask, metal is plated on the conductor 23 at the bottom of the hole 212 so that the hole 212 is filled with metal 213. The metal 214 may include gold, silver, nickel, copper, palladium, etc.

Figure 3D:
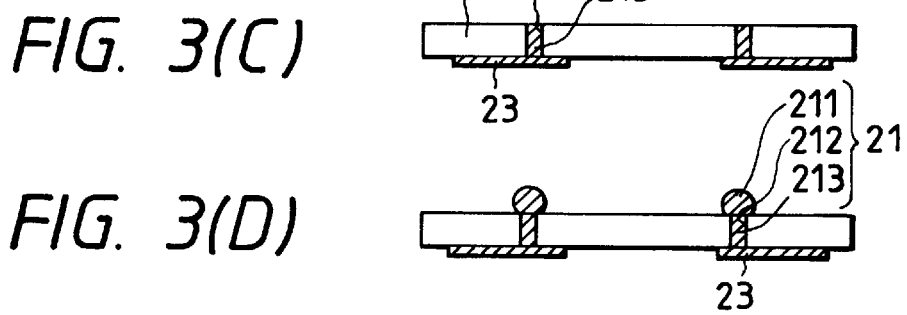

After the hole 212 is filled with metal, as shown in FIG. 3(D), metallic bumps 211 each having a height of 10 to 150 $\mu$m are formed on the filling metals 213. Thus, the inner electrode 21 is formed. The metallic bump 211 can be formed by a technique of melting the tip of a gold wire, copper wire or solder wire into a sphere using a wire bonder and fusing the spherical metal with the surface of the filling metal. Where the gold wire is used, in order to prevent contact between the routing conductor 23 and gold, the upper layer of the filling metal 213 may be made of nickel. The metallic bump 223 may be formed by the method of swelling metal on the surface of the filling metal by the wet plating technique.

The wire bonder technique permits the metallic bump having a large contact angle on the filling metal surface to be formed regularly. This is because the periphery of the hole 212 is made of the synthetic resin with low wetness for the molten metal to prevent the molten metal from being applied to the periphery of the hole. The plating technique which may be either electrolytic or non-electrolytic plating permits the metallic bump to be formed regularly using the exposed end of the filling metals 213 as nuclei.

Figure 3E:
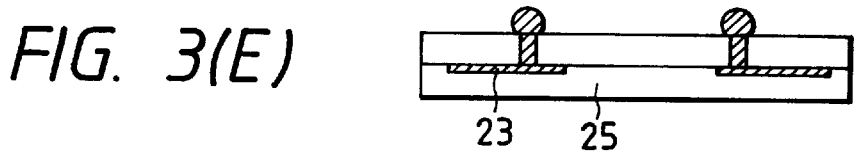
Figure 3F:
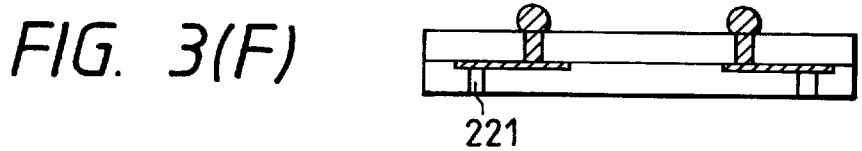
Figure 3G:
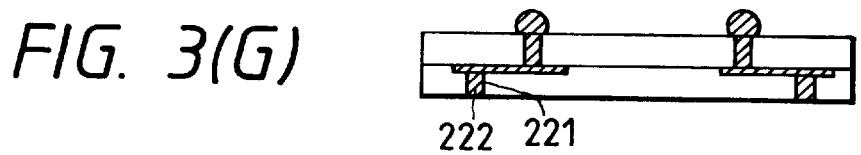

In this way, after the inner electrode 21 is formed, as shown in FIG. 3(E), the surface of the printed routing conductor 23 is coated with resin 25. In the coated resin layer 25 are made holes 221 for outer electrodes. Each of the holes 221 is filled with solder 222 using the above wire bonder, thus forming the outer electrodes. Thus, an auxiliary wiring plate 2 as shown in FIG. 3(G) can be prepared.

Figure 3H:
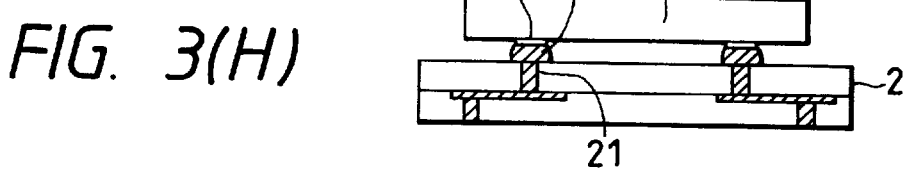

Thereafter, as shown in FIG. 3(H), a semiconductor chip 1 is electrically and mechanically connected to the auxiliary wiring plate 2 in the following manner. Namely, with the metallic bumps 211 of the inner electrodes 21 aligned with the electrodes 11 of the semiconductor chip 1, they are metal-connected to each other by the whole crimp connection such as "hot bar", "pulse heat", etc., or individual thermal crimp connection by the single point bonder. In carry out the individual thermal crimp by the single point bonder, it is preferable that ultrasonic connection is also used to lower the thermal crimp temperature.

With solder bumps used for the metallic bumps 211 of the inner electrodes 21, the auxiliary wiring plate 2 and the semiconductor chip 1 can be connected to each other by the reflow technique. In this case, slight deviation of the electrode 11 of the semiconductor chip 1 from the inner electrode 21 can be automatically corrected by surface tension of the molten solder, thus making the action described later unnecessary.

Figure 3I:
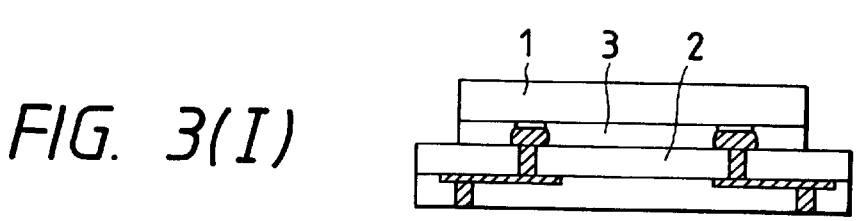

Thus, after the semiconductor chip 1 is mounted on the auxiliary wiring plate 2, as shown in FIG. 3(I), the space between the semiconductor chip 1 and the auxiliary wiring plate 2 is sealed with resin 3. The resin sealing can be carried using transfer molding, potting, casting, etc,.

After the resin sealing, as shown in FIG. 1, the solder bump 223 is formed on the end surface of the filling metal of the outer electrode 22. Thus, the manufacturing process to the packaging step of the semiconductor device is ended.

Figure 4:
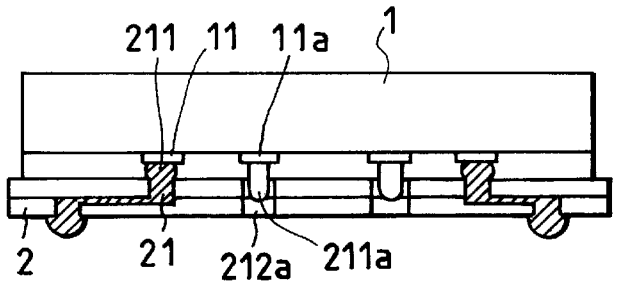
FIG. 4 is an explanation view showing a further embodiment of the semiconductor device according to the present invention.

The alignment step as shown in FIG. 3(H) of the electrode 11 of the semiconductor chip 1 with the metallic bump 211 of the inner electrode 21 of the auxiliary wiring plate 2 can be performed in such a manner as shown in FIG. 4 that bump 211a for alignment are attached to the dummy electrode 11a of the semiconductor chip 1, a hole 212a for alignment are made in the auxiliary wiring plate 2, and the bump 211a for alignment is fit into the hole 212a for alignment. In this case, the bump 211a for alignment is made slightly higher than the metallic bump 211 of the inner electrode 21. For example, the bump 211a has a height of 50 $\mu$m whereas the metallic bump 211 has a height of 20 $\mu$m. The bump 211a for alignment is made of the material enough to be softened at the temperature when the electrode 11 of the semiconductor chip 1 and the inner metallic bump 211 of the auxiliary wiring plate 2 are pressured for connection to each other, and is not particularly limited when they are not pressured. The hole 212a for alignment is set for such a diameter as to suppress the deviation of the electrode of the semiconductor chip 1 from the inner metallic bump 211 of the auxiliary wiring plate 2 within 10% or less.

The mounting of the semiconductor device according to the present invention can be carried out by the reflow technique. In this case, any possible slight deviation of the external electrode of the semiconductor device from the conductor terminal of the circuit board can be automatically corrected by surface tension of molten solder.

The process of fabricating the semiconductor device can be modified as required. For example, after the coating is made and before the outer electrode is formed, the semiconductor chip is connected, the space between the semiconductor chip and the auxiliary wiring chip may be resin-sealed and thereafter the outer electrode may be formed on the coating.

Figure 5A:
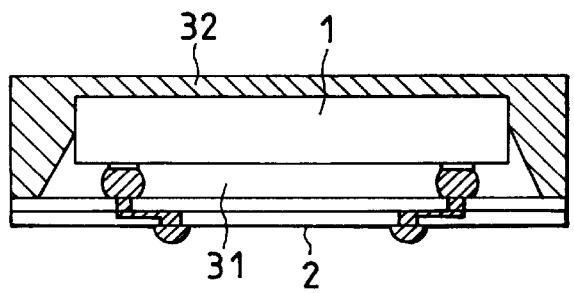
FIG. 5(A) to FIG. 5(D) are explanation views showing still further embodiments of the semiconductor device according to the present invention.

In the semiconductor device according to the present invention, only the space between the semiconductor chip and auxiliary wiring plate can be sealed. As shown in FIG. 5(A) to FIG. 5 (D), the entire outer surf ace of the semiconductor chip including the transverse edges and back face thereof can be sealed.

Figure 5B:
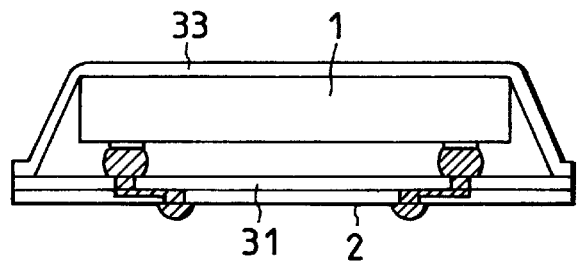
Figure 5C:
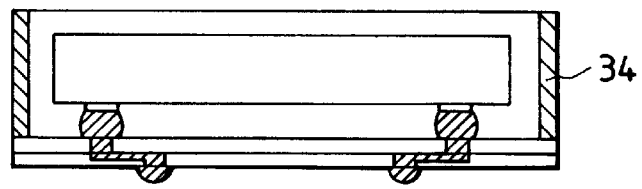
Figure 5D:
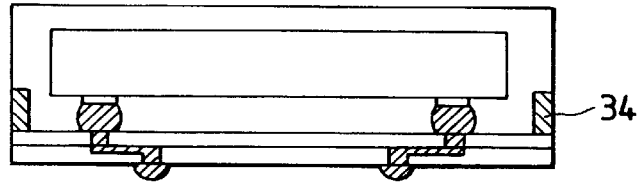

In FIG. 5(A), the space between the semiconductor chip 1 and the auxiliary wiring plate 2 is sealed by epoxy resin 31, and the transverse edge and back face of the semiconductor chip 1 are sealed by silicon resin 32. In FIG. 5(B), the space between the semiconductor chip 1 and the auxiliary wiring plate 2 is sealed by epoxy resin 31, and the transverse edge and back face of the semiconductor chip 1 are sealed by bonding of a bonding seat 33 (e.g. using epoxy-rubber resin as bonding agent). In FIG. 5(C) and FIG. 5(D), a reinforcement frame 34 (made of synthetic resin or metal) is fixedly attached.

As shown in FIGS. 6(A) to 6(D), for radiation of heat sink of the semiconductor chip, only the transverse edge of the semiconductor chip may be sealed and the back face thereof may be exposed.

Figure 6A:
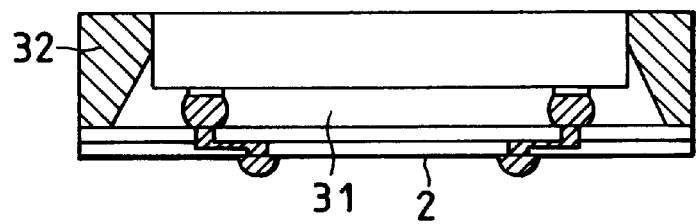
FIG. 6(A) to FIG. 6(E) are explanation views showing yet further embodiments of the semiconductor device according to the present invention.
Figure 6B:
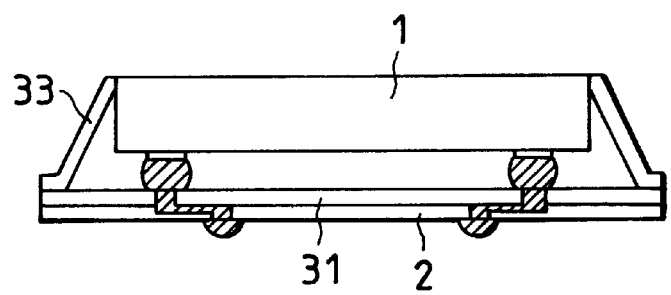
Figure 6C:
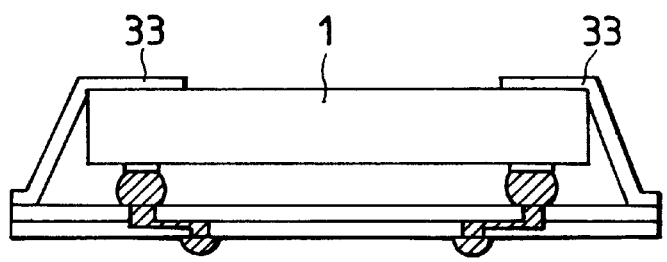
Figure 6D:
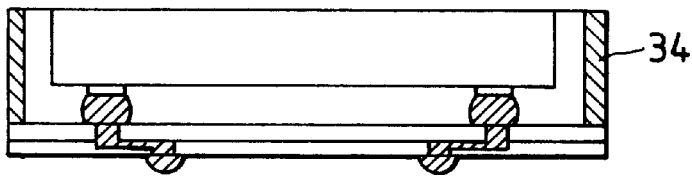
Figure 6E:
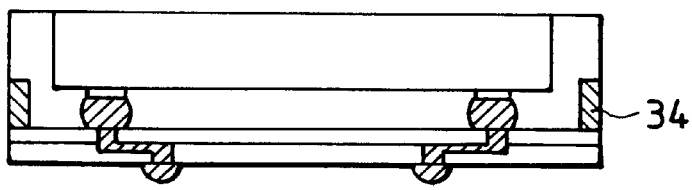

In FIG. 6(A), the space between the semiconductor chip 1 and the auxiliary wiring plate 2 is sealed by epoxy resin 31, and the back face is exposed and the transverse edges thereof are sealed by silicon resin. In FIG. 6(B), the space between the semiconductor chip 1 and the auxiliary wiring plate 2 is sealed by epoxy resin 31, the back face of the semiconductor chip 1 is exposed and the transverse edges thereof is sealed by bonding the bonding sheet 33 (e.g. using epoxy-rubber resin as bonding agent). In FIG. 6(C), the bonding sheet 33 is bonded so as to extend to the ends of the back face of the semiconductor chip 1. In FIG. 6(D) or FIG. 6(E), a reinforcement frame 34 (made of synthetic resin or metal) is fixedly attached.

Figure 7A:
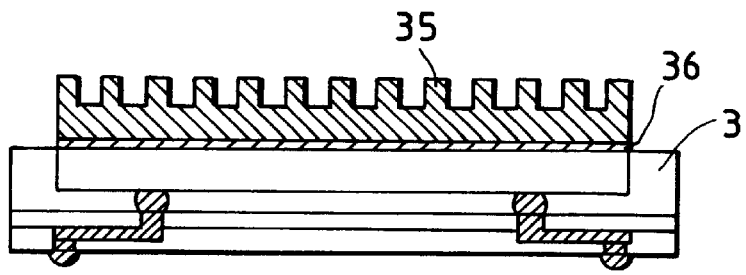
FIG. 7(A) to FIG. 7(C) are explanation views showing still more further embodiments of the semiconductor device according to the present invention.
Figure 7B:
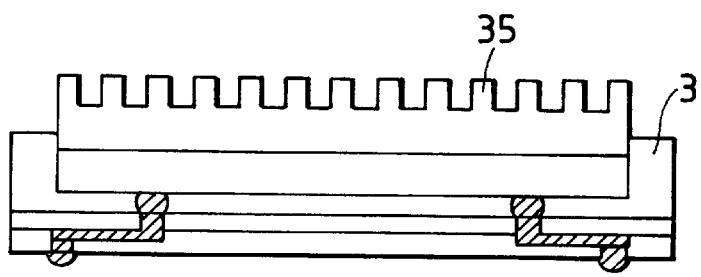
Figure 7C:
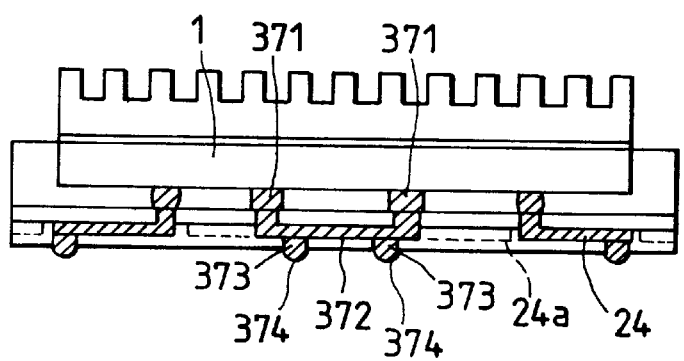

In order to improve radiation of heat of the semiconductor chip, as shown in FIG. 7(A) to FIG. 7(B), it is efficient to attach a radiation fin or heat spreader 35 (In FIG. 7(A), the fin 35 is fixed by thermally conductive bonding agent and in FIG. 7(B), the fin 35 is fixed by sealing resin 3). Further, as shown in FIG. 7(C), it is efficient to radiate the heat generated by the semiconductor chip 1 through the path including inner-metal-filled holes 371 not in contact with the electrode of the semiconductor chip 1, an inner conductor 372 (not the routing conductor) thermally connected to the filling metal 371, outer-metal-filled holes 373 thermally connected to the inner conductor and metallic bumps 374. As indicated by dotted line in FIG. 7(C), it is also efficient to provide a dummy of heat dissipation such as using more conductor (copper foil) 24a left with a predetermined gap from the routing conductor 24 as a heat spreader.

In the semiconductor device according to the present invention, if the bonding force at the boundary between the semiconductor chip and the sealed resin is increased, intrusion of water or ionic impurities from the boundary can be prevented so that the reliability of the semiconductor chip can be improved. Thus, as apparent from the test result described below, the insulating supporting film for the auxiliary wiring plate having a surface tension (critical surface tension obtained from the Zisman plot) of 35 mJ/m$^2$ or more, preferably 40 J/m$^2$ can provide the bonding force of the boundary of 300 g/cm or more, preferably 500 g/cm or more and particularly preferably 1000 g/cm in the 90 degree exfoliation strength (at room temperature in a dry state), thereby remarkably decreasing the conductive failure rate to improve the reliability of the semiconductor device (Such a synthetic resin film, even if its initial surface tension is 35 mJ/m$^2$ or less, can be obtained by the chemical treatment such acid, alkaline treatment, coupling treatment, graft treatment, etc. and the physical treatment such as corona discharge treatment, high frequency plasma treatment, ion etching, etc.

Experimental Result A

An inner electrode with the gold bump having a height of 50 $\mu$m is formed on an auxiliary wiring plate (having the same size as the chip) with a supporting film having a thickness of 60 $\mu$m listed in Table 1 in which PI denotes polyimide; PET polyethylene terephthalate; PP polypropylene; alkaline treatment immersion for 5 hours in 0.1 N KOH water solution; plasma treatment grow discharge for 30 sec at 100 W and 13.56 MHz in oxygen gas atmosphere at 0.1 torr); a semiconductor chip for estimation of reliability having a thickness of 0.375 mm with a square shape of one side of 15.0 mm long is connected to the auxiliary wiring plate at 300° C.; resin sealing having outer dimensions of a thickness of 0.550 mm and one side of 17.0 mm is performed using the composition in Table 2 in which epoxy resin 1 denotes bisphenol A type epoxy resin having an epoxy equivalent weight of 180; epoxy resin 2 denotes cresol novolac resin having an epoxy equivalent weight of 195; acid anhydride denotes methyl hexahydro phthalic anhydride; PPS denotes polyphenylene sulfide; the composition is represented by weight), thus making embodiments 1 to 15 and comparison examples 1 to 6 (these comparison examples are included in the invention defined by claim 1). For these embodiments and comparison examples, the 90 degree exfoliation strength and the conductive failure rates after 200 hours pressure-cooker test in 121° C. saturated vapor were measured. Table 3 shows the test results.

In the semiconductor device according to the present invention, in order to increase the bonding force at the boundary between the semiconductor chip and the sealing resin to improve reliability of the semiconductor device, as apparent from the experimental result B described below, it is also efficient to form uneven spots each having 0.005 $\mu$m to 0. 5 $\mu$m on the entire surface of the insulating supporting film for the auxiliary wiring plate.

Experimental Result B

Each of the films made of the materials and thicknesses as listed in Table 4 is surface-treated (In FIG. 4, ion etching represents irradiation of the high frequency 200 W power at 13. 56 MHz for 5 minutes at 3×10E-3 Torr in an nitrogen gas atmosphere; solvent treatment represents 3 hour immersion in hot xylene; alkaline treatment represents 5 hour immersion in 0.1 N KOH solution; ultraviolet rays treatment represents irradiation of ultraviolet rays of 100 W; and corona treatment represents irradiation of low frequency corona of 33 W at 1200 MHz for 1 minute); an inner electrode with the gold bump having a height of 50 $\mu$m is formed on an auxiliary wiring plate (having the same size as the chip) with the supporting film having a rugged surface; a semiconductor chip for estimation of reliability having a thickness of 0.375 mm with a square shape of one side of 15.0 mm long is connected to the auxiliary wiring plate at 300° C.; resin sealing having outer dimensions of a thickness of 0.550 mm and one side of 17.0 mm is performed using the composition in Table 5 in which epoxy resin 1 denotes bisphenol A type epoxy resin having an epoxy equivalent weight of 180; epoxy resin 2 denotes cresol novolac resin having an epoxy equivalent weight of 190; acid anhydride denotes methyl hexahydro phthalic anhydride; PPS denotes polyphenylene sulfide; the composition is represented by weight), thus making embodiments 1' to 20' and comparison examples 1' to 9' (these comparison examples are included in the invention defined by claim 1). For each of these embodiments and comparison examples, the 90 degree exfoliation strength and the conductive failure rate described above is measured. Table 6 shows the test results.

Figure 8:
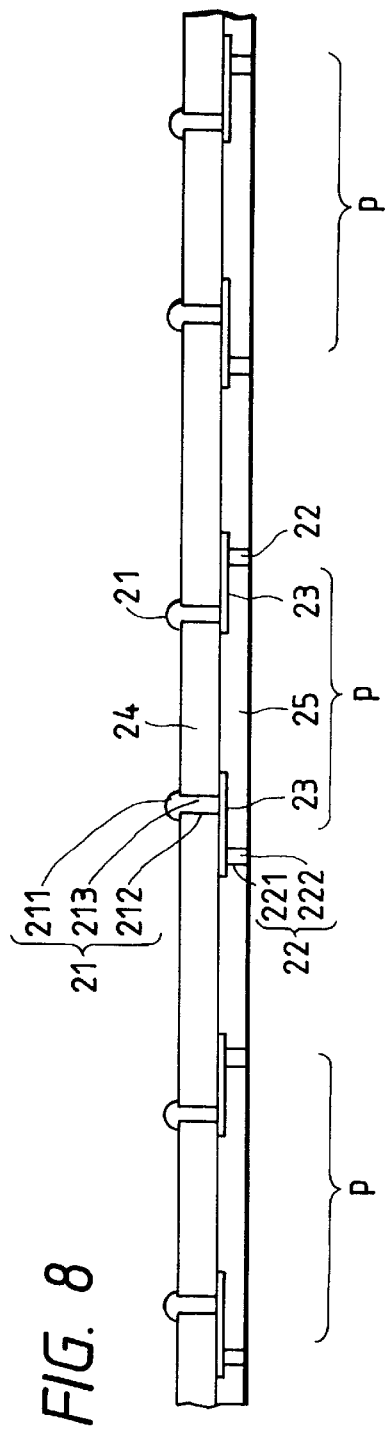
FIG. 8 is an explanation view showing one embodiment of a film carrier tape used in the method of manufacturing a semiconductor device according to the present invention.
Figure 9:
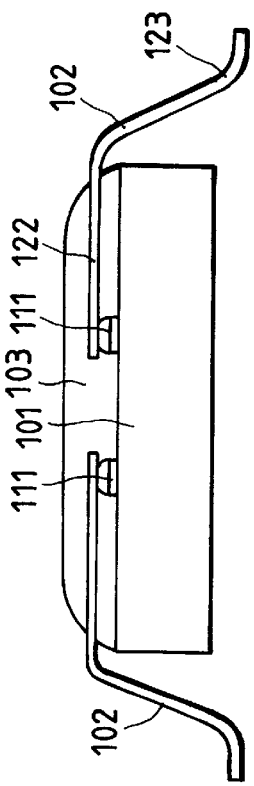
FIG. 9 is a view showing the prior art.
Figure 10:
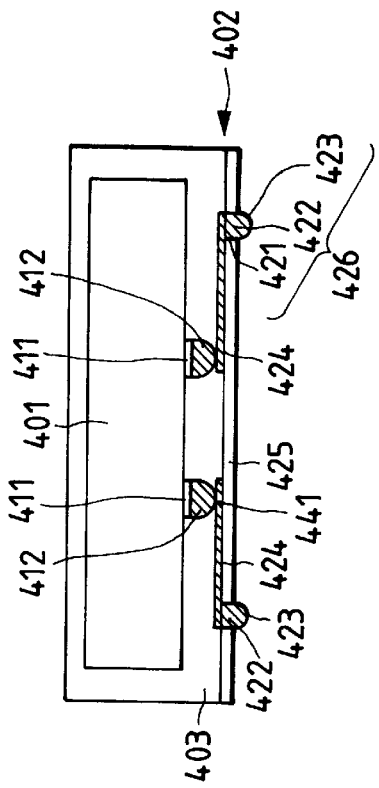
FIG. 10 is a view showing another prior art.

The semiconductor device according to the present invention can be also manufactured by the TAB technique. FIG. 8 shows the film carrier tape used in the TAB technique.

In FIG. 8, reference numerals 24 and 25 denote insulating films. Symbol P (plural) denote a group of wirings having a large number of similar patterns arranged at predetermined intervals in a longitudinal direction of the film carrier. A single wiring pattern corresponds a single semiconductor chip. Each of the wiring patterns includes routing conductors 23 sandwiched between the insulating layers 24 and 25, inner electrodes 21 and outer electrodes 22. Each of the inner electrodes 21 includes a hole 212 made in the insulating layer 24 so as to view the electrode side of the semiconductor chip from the routing conductor 23, metal 213 filled in the hole 211 and a bump 211 formed so as to protrude from the hole 212. Each of the outer electrodes 22 includes a hole 221 made in the insulating film 24 and metal 222 filled in the hole 221. Sprocket holes (not shown) are also formed in the film carrier tape.

The semiconductor device according to the present invention is fabricated in the following process. While the film carrier as shown in FIG. 8 is transported intermittently by sprockets, at a chip attachment station, the semiconductor chip is connected to the inner electrodes of the wiring pattern, at a sealing station, the semiconductor chip is resin-sealed by transfer molding, potting, casting, etc., and finally the film carrier is punched to define the periphery of the semiconductor chip, thus completing the fabrication process to the packaging step of the semiconductor chip.

TABLE 1

|  | Film Carrier | $\gamma$(mJ/cm$^2$) |
| --- | --- | --- |
| Embodiments 1, 6, 11 | PI | 47 |
| Embodiments 2, 7, 12 | PET | 42 |
| Embodiments 3, 8, 13 | Alkaline Treatment PET | 53 |
| Embodiments 4, 9, 14 | Plasma Treatment PP | 59 |
| Embodiments 5, 10, 15 | Plasma Treatment PI | 65 |
| Comparison Examples 1–3 | Teflon | 20 |
| Comparison Examples 4–6 | PP | 29 |

TABLE 2

|  | Embodiments 1–5, Comparison Examples 1, 4 | Embodiments 6–10, Comparison Examples 2, 5 | Embodiments 11–15, Comparison Examples 3, 6 |
| --- | --- | --- | --- |
| Epoxy Resin 1 | 100 | — | — |
| Acid Anhydride | 100 | — | — |
| Epoxy Resin 2 | — | 200 | — |
| Phenol Resin | — | 100 | — |
| 2-Methylimidazole | 0.4 | 0.5 | — |
| Silica | — | 700 | — |

TABLE 2-continued

|  | Embodiments 1–5, Comparison Examples 1, 4 | Embodiments 6–10, Comparison Examples 2, 5 | Embodiments 11–15, Comparison Examples 3, 6 |
| --- | --- | --- | --- |
| PPS | — | — | 100 |
| Glass Fiber | — | — | 100 |

TABLE 3

|  | Bonding Force (g/cm) | Conduction Failure Rate (%) |
| --- | --- | --- |
| Embodiment 1 | 800 | 2 |
| Embodiment 2 | 600 | 2 |
| Embodiment 3 | 950 | 1 |
| Embodiment 4 | 1100 | 0 |
| Embodiment 5 | 1800 | 0 |
| Embodiment 6 | 850 | 1 |
| Embodiment 7 | 700 | 2 |
| Embodiment 8 | 1000 | 0 |
| Embodiment 9 | 1400 | 0 |
| Embodiment 10 | 2200 | 0 |
| Embodiment 11 | 450 | 3 |
| Embodiment 12 | 350 | 5 |
| Embodiment 13 | 550 | 2 |
| Embodiment 14 | 700 | 2 |
| Embodiment 15 | 1000 | 0 |
| Comparison Example 1 | 20 | 60 |
| Comparison Example 2 | 30 | 40 |
| Comparison Example 3 | 10 | 70 |
| Comparison Example 4 | 200 | 20 |
| Comparison Example 5 | 130 | 26 |
| Comparison Example 6 | 80 | 35 |

TABLE 4

|  | Film Material | Film Thickness ($\mu$m) | Surface Treatment | Surface Unevenness ($\mu$m) |
| --- | --- | --- | --- | --- |
| Embodiment 1' | Polyimide | 50 | Ion etching | 0.05 |
| Embodiment 2' | Polyethylene terephthalate | 50 | Ion etching | 0.06 |
| Embodiment 3' | Polymethyl pentene | 80 | Ion etching | 0.07 |
| Embodiment 4' | Polyphenylene sulfide | 30 | Ion etching | 0.01 |
| Embodiment 5' | Polyether sulfone | 20 | Ion etching | 0.03 |
| Embodiment 6' | Polyether etherketone | 40 | Ion etching | 0.04 |
| Embodiment 7' | Teflon | 100 | Ion etching | 0.08 |
| Embodiment 8' | Polyimide | 50 | Ion etching | 0.05 |
| Embodiment 9' | Polyethylene terephthalate | 50 | Ion etching | 0.06 |
| Embodiment 10' | Polymethyl pentene | 80 | Ion etching | 0.07 |
| Embodiment 11' | Polyphenylene sulfide | 30 | Ion etching | 0.01 |
| Embodiment 12' | Polyether sulfone | 20 | Ion etching | 0.03 |
| Embodiment 13' | Polyether etherketone | 40 | Ion etching | 0.04 |
| Embodiment 14' | Teflon | 100 | Ion etching | 0.08 |
| Embodiment 15' | Polymethyl pentene | 80 | Solvent Treatment | 0.08 |
| Embodiment 16' | Polyethylene terephthalate | 50 | Alkaline Treatment | 0.1 |

TABLE 4-continued

| | Film Material | Film Thickness (μm) | Surface Treatment | Surface Unevenness (μm) |
|---|---|---|---|---|
| Embodiment 17' | Polyimide | 50 | Ultraviolet rays treatment | 0.02 |
| Embodiment 18' | Polyethylene terephthalate | 50 | Corona Treatment | 0.1 |
| Embodiment 19' | Polyimide | 50 | Sandblasting | 0.18 |
| Embodiment 20' | Polyimide | 50 | Ion etching | 0.05 |
| Comparison Example 1' | Polyimide | 50 | — | <0.002 |
| Comparison Example 2' | Polyimide | 50 | — | <0.002 |
| Comparison Example 3' | Polyimide | 50 | — | <0.002 |
| Comparison Example 4' | Polyethylene terephthalate | 50 | Alkaline Treatment | 1 |
| Comparison Example 5' | Polyethylene terephthalate | 50 | Alkaline Treatment | 1 |
| Comparison Example 6' | Polyethylene terephthalate | 50 | Alkaline Treatment | 1 |
| Comparison Example 7' | Polyimide | 50 | Ion etching | 0.8 |
| Comparison Example 8' | Polyimide | 50 | Ion etching | 0.8 |
| Comparison Example 9' | Polyimide | 50 | Ion etching | 0.8 |

TABLE 5

| | Embodiments 1'–7', Comparison Examples 1', 4', 7' | Embodiments 7'–19', Comparison Examples 2', 5', 8' | Embodiments 20', Comparison Examples 3', 6', 9' |
|---|---|---|---|
| Epoxy Resin 1 | 100 | — | — |
| Acid Anhydride | 100 | — | — |
| Epoxy Resin 2 | — | 200 | — |
| Phenol Resin | — | 100 | — |
| 2-methylimidazole | 0.4 | 0.5 | — |
| Silica | — | 700 | — |
| PPS | — | — | 100 |
| Glass Fiber | — | — | 100 |

TABLE 6

| | Bonding Force (g/cm) | Conduction Failure Rate (%) |
|---|---|---|
| Embodiment 1' | 1500 | 0 |
| Embodiment 2' | 1300 | 0 |
| Embodiment 3' | 900 | 1 |
| Embodiment 4' | 700 | 2 |
| Embodiment 5' | 1100 | 0 |
| Embodiment 6' | 1000 | 1 |
| Embodiment 7' | 600 | 3 |
| Embodiment 8' | 2000 | 0 |
| Embodiment 9' | 1600 | 0 |
| Embodiment 10' | 1200 | 0 |
| Embodiment 11' | 1200 | 0 |
| Embodiment 12' | 1400 | 0 |
| Embodiment 13' | 1400 | 0 |
| Embodiment 14' | 800 | 2 |
| Embodiment 15' | 500 | 5 |
| Embodiment 16' | 800 | 2 |
| Embodiment 17' | 1000 | 1 |
| Embodiment 18' | 1200 | 0 |
| Embodiment 19' | 600 | 4 |
| Embodiment 20' | 800 | 2 |
| Comparison Example 1' | 20 | 60 |
| Comparison Example 2' | 30 | 40 |
| Comparison Example 3' | 10 | 70 |
| Comparison Example 4' | 100 | 22 |
| Comparison Example 5' | 120 | 18 |
| Comparison Example 6' | 80 | 25 |
| Comparison Example 7' | 150 | 14 |
| Comparison Example 8' | 180 | 12 |
| Comparison Example 9' | 140 | 15 |

What is claimed is:

1. A semiconductor device comprising:

a semiconductor chip having an electrode;

a first insulating layer facing said semiconductor chip, said first insulating layer comprising a thin flexible layer of a synthetic resin;

a second insulating layer laminated on said first insulating layer;

an inner electrode fixed on said first insulating layer, said inner electrode being connected to said electrode of said semiconductor chip;

an outer electrode fixed on said second insulating layer, said outer electrode being connected to a conductor end of a circuit board;

a routing conductor bridging said inner and outer electrodes, said routing conductor being sandwiched by said first and second insulating layers; and resin sealing the space between said semiconductor chip and said first insulating layer.

2. The semiconductor device according to claim 1, further comprising:

other insulating layers; and other routing conductors;

wherein each routing conductor is sandwiched by a different pair of insulating layers.

3. The semiconductor device according to claim 1, wherein the transverse edges of the outer surface of said semiconductor chip are sealed with one of resin and a bonding sheet.

4. The semiconductor device according to claim 1, wherein the entire outer surface of said semiconductor chip is sealed with one of resin and a bonding sheet.

5. The semiconductor device according to claim 1, wherein the planar area of said first and second insulating layers is in the range from equal to that of said semiconductor chip to 200% of that of said semiconductor chip.

6. The semiconductor device according to claim 1, wherein said inner electrode includes a metallic bump made protruded from said first insulating layer.

7. The semiconductor device according to claim 1, wherein said inner electrode is located at a different position from the back position of said outer electrode.

8. A semiconductor device comprising:

a semiconductor chip having an electrode;

a first insulating layer facing said semiconductor chip;

a second insulating layer laminated on said first insulating layer;

an inner electrode fixed on said first insulating layer, said inner electrode being connected to said electrode of said semiconductor chip;

an outer electrode fixed on said second insulating layer, said outer electrode being connected to a conductor end of a circuit board;

a routing conductor bridging said inner and outer electrodes, said routing conductor being sandwiched by said first and second insulating layers; and resin sealing the space between said semiconductor chip and said first insulating layer, wherein the surface tension of said first insulating layer in contact with said sealing resin is larger than 35 mJ/m$^2$.

9. A semiconductor device comprising:

a semiconductor chip having an electrode;

a first insulating layer facing said semiconductor chip;

a second insulating layer laminated on said first insulating layer;

an inner electrode fixed on said first insulating layer, said inner electrode being connected to said electrode of said semiconductor chip;

an outer electrode fixed on said second insulating layer, said outer electrode being connected to a conductor end of a circuit board;

a routing conductor bridging said inner and outer electrodes, said routing conductor being sandwiched by said first and second insulating layers; and resin sealing the space between said semiconductor chip and said first insulating layer, wherein the surface of said first insulating layer in contact with said sealing resin has uneven spots each having a diameter in the range from 0.005 mm to 0.5 mm.

10. A semiconductor device comprising:

a semiconductor chip having an electrode;

an inner electrode connected to said electrode of said semiconductor chip;

an outer electrode connected to a conductor end of a circuit board;

a first insulating support film facing said semiconductor chip, said first insulating support film having a first hole, said first hole being filled with metal so as to form said inner electrode, said first insulating support film comprising a thin flexible layer of a synthetic resin;

a second insulating support film laminated on said first insulating support film, said first insulating support film having a second hole, said second hole being filled with metal so as to form said outer electrode;

a routing conductor bridging said inner and outer electrodes, said routing conductor being sandwiched by said first and second insulating support films; and resin sealing the space between said semiconductor chip and said first insulating support film.

11. The semiconductor device according to claim 10, further comprising:

other insulating support films; and other routing conductors;

wherein each routing conductor is sandwiched by a different pair of said insulating support films.

12. The semiconductor device according to claim 10, wherein the transverse edges of the outer surface of said semiconductor chip are sealed with one of resin and a bonding sheet.

13. The semiconductor device according to claim 10, wherein the entire outer surface of said semiconductor chip is sealed with one of resin and a bonding sheet.

14. The semiconductor device according to claim 10, wherein the planar area of said first and second insulating support films is in the range from equal to that of said semiconductor chip to 200% of that of said semiconductor chip.

15. The semiconductor device according to claim 10, wherein said inner electrode includes a metallic bump made protruded from said first hole.

16. The semiconductor device according to claim 10, wherein said inner electrode is located at a different position from the back position of said outer electrode.

17. A semiconductor device comprising:

a semiconductor chip having an electrode;

an inner electrode connected to said electrode of said semiconductor chip;

an outer electrode connected to a conductor end of a circuit board;

a first insulating support film facing said semiconductor chip, said first insulating support film having a first hole, said first hole being filled with metal to form said inner electrode;

a second insulating support film laminated on said first insulating support film, said first insulating support film having a second hole, said second hole being filled with metal to form said outer electrode;

a routing conductor bridging said inner and outer electrodes, said routing conductor being sandwiched by said first and second insulating support films; and resin sealing the space between said semiconductor chip and said first insulating support film, wherein the surface tension of said first insulating support film in contact with said sealing resin is larger than 35 mJ/m$^2$.

18. A semiconductor device comprising:

a semiconductor chip having an electrode;

an inner electrode connected to said electrode of said semiconductor chip;

an outer electrode connected to a conductor end of a circuit board;

a first insulating support film facing said semiconductor chip, said first insulating support film having a first hole, said first hole being filled with metal to form said inner electrode;

a second insulating support film laminated on said first insulating support film, said first insulating support film having a second hole, said second hole being filled with metal to form said outer electrode;

a routing conductor bridging said inner and outer electrodes, said routing conductor being sandwiched by said first and second insulating support films; and resin sealing the space between said semiconductor chip and said first insulating support film, wherein the surface of said first insulating support film in contact with said sealing resin has uneven spots each having a diameter in the range from 0.005 mm to 0.5 mm.

19. A semiconductor device comprising:

a semiconductor chip having an electrode;

an inner electrode connected to said electrode of said semiconductor chip;

an outer electrode connected to a conductor end of a circuit board;

a first insulating support film facing said semiconductor chip, said first insulating support film having a first hole, said first hole being filled with metal to form said inner electrode;

a second insulating support film laminated on said first insulating support film, said first insulating support film having a second hole, said second hole being filled with metal to form said outer electrode;

a routing conductor bridging said inner and outer electrodes, said routing conductor being sandwiched by said first and second insulating support films; and resin sealing the space between said semiconductor chip and said first insulating support film, wherein said outer electrode includes a metallic bump made protruded from said second insulating support film.

* * * * *